United States Patent
Kawai et al.

(10) Patent No.: US 10,276,766 B2
(45) Date of Patent: Apr. 30, 2019

(54) LIGHT-EMITTING DEVICE

(71) Applicant: STANLEY ELECTRIC CO., LTD., Meguro-ku, Tokyo (JP)

(72) Inventors: Ryosuke Kawai, Yokohama (JP); Mamoru Miyachi, Yokohama (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 122 days.

(21) Appl. No.: 15/494,080

(22) Filed: Apr. 21, 2017

(65) Prior Publication Data

US 2017/0309801 A1   Oct. 26, 2017

(30) Foreign Application Priority Data

Apr. 22, 2016 (JP) ................................ 2016-086539

(51) Int. Cl.
| | |
|---|---|
| H01L 33/62 | (2010.01) |
| H01L 27/15 | (2006.01) |
| H01L 33/48 | (2010.01) |
| H01L 33/50 | (2010.01) |

(52) U.S. Cl.
CPC ............ *H01L 33/62* (2013.01); *H01L 27/153* (2013.01); *H01L 33/486* (2013.01); *H01L 33/507* (2013.01)

(58) Field of Classification Search
CPC .............. H01L 27/153; H01L 33/486; H01L 2224/0603; H01L 2224/06051; H01L 33/62; H01L 33/507
See application file for complete search history.

(56) References Cited

U.S. PATENT DOCUMENTS

| | | | | |
|---|---|---|---|---|
| 5,134,340 A | * | 7/1992 | Haitz | B41J 2/45 257/88 |
| 2005/0253161 A1 | * | 11/2005 | Horio | H01L 33/08 257/100 |
| 2012/0126259 A1 | * | 5/2012 | Mizutani | H01L 27/156 257/88 |
| 2012/0205675 A1 | * | 8/2012 | Yamazaki | H01L 27/3202 257/88 |
| 2013/0161655 A1 | * | 6/2013 | Xu | H01L 25/0753 257/88 |
| 2015/0267906 A1 | * | 9/2015 | Wilcox | F21V 23/003 362/311.02 |
| 2016/0336251 A1 | * | 11/2016 | Fukuoka | H01L 29/7395 |

FOREIGN PATENT DOCUMENTS

JP          2015146449 A        8/2015

* cited by examiner

*Primary Examiner* — Charles D Garber
*Assistant Examiner* — Alia Sabur
(74) *Attorney, Agent, or Firm* — Holtz, Holtz & Volek PC

(57) ABSTRACT

The light-emitting device of the present invention includes: a support; a plurality of light-emitting elements arranged in a row on the support; and a conductor trace portion configured from a plurality of conductor traces which extend on the support from one end portion of the row to the other end portion of the row which are each electrically connected to each of the plurality of light-emitting elements. Each of the plurality of conductor traces is configured such that the trace width in the direction of extension in a region under one light-emitting element to which the conductor trace is electrically connected is greater than the trace width in a region extending in the direction of extension side by side with a conductor trace connected to a light-emitting element disposed closer to the one end portion than the one light-emitting element is.

13 Claims, 7 Drawing Sheets

LIGHT-EMITTING DEVICE

BACKGROUND OF THE INVENTION

1. Field of the Invention

The present invention relates to a light-emitting device and particularly, to a light-emitting device which employs a light-emitting diode (LED).

2. Description of the Related Art

Light-emitting devices in which a plurality of light-emitting elements are mounted have conventionally been employed in lighting devices, backlights, and industrial machines. Patent Literature 1 (Japanese Patent Application Laid-Open No. 2015-146449) discloses a light-emitting device which includes: a substrate having a base flexible to extend in a first direction or a longitudinal direction, a plurality of conductor trace portions provided on the base, and a groove portion in which the plurality of conductor trace portions are provided by being spaced from each other; and light-emitting elements disposed on the substrate and electrically connected to the plurality of conductor trace portions.

SUMMARY OF THE INVENTION

The structure of the light-emitting device disclosed in Patent Literature 1 is employed for implementing flip chip elements on a substrate. However, for example, when used for an adaptive driving beam (ADB, or distribution variable headlamp), such a structure makes it difficult to implement a plurality of light-emitting elements at narrow intervals. For example, this caused a dark portion to be formed between the light-emitting elements at the time of the light-emitting device being turned on.

Furthermore, as in Patent Literature 1, in the light-emitting device in which the plurality of light-emitting elements are mounted in a row on the substrate, when power is supplied through conductor traces from an end portion of the substrate to each light-emitting element, conductor traces to elements farther from the end portion will have greater conductor trace resistance. This would cause unevenness in drive voltage as a whole or an increase in drive voltage (increase in maximum value). This in turn caused unevenness in the irradiation beams.

The present invention has been made in view of the aforementioned circumstances. It is an object of the present invention to provide a light-emitting device which is capable of preventing the leakage of light to an adjacent light-emitting region and reducing a dark portion between the light-emitting regions as well as preventing the unevenness in drive voltage between the elements or an increase in drive voltage.

A light-emitting device according to the present invention includes: a support; a plurality of light-emitting elements arranged in a row on the support; and a conductor trace portion configured from a plurality of conductor traces which extend on the support from one end portion of the row to the other end portion of the row and which are each electrically connected to each of the plurality of light-emitting elements. Each of the plurality of conductor traces is characterized in that the trace width in the direction of extension in a region under one light-emitting element to which the conductor trace is electrically connected is greater than the trace width in a region extending in the direction of extension side by side with a conductor trace connected to a light-emitting element disposed closer to the one end portion than the one light-emitting element is.

DETAILED DESCRIPTION OF THE INVENTION

In the description below, preferred embodiments of the present invention will be described. However, these will be modified, as appropriate, and may also be combined. Furthermore, in the following description and the accompanying drawings, substantially the same or equivalent components will be given the same reference symbols for explanation.

Embodiment

Figure 1A:
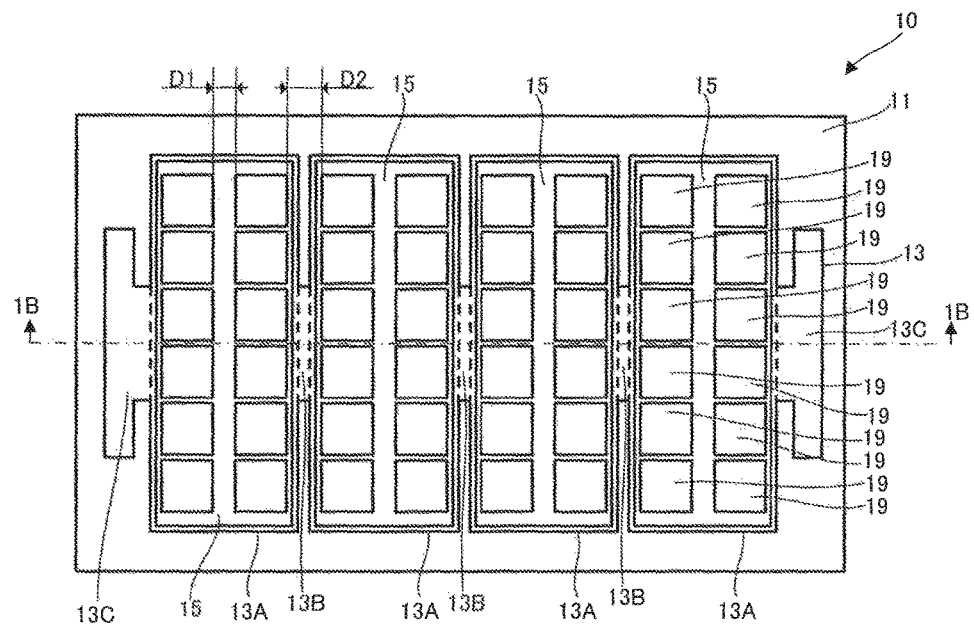
FIG. 1A is a top plan view illustrating a light-emitting device according to an embodiment of the present invention.
Figure 1B:
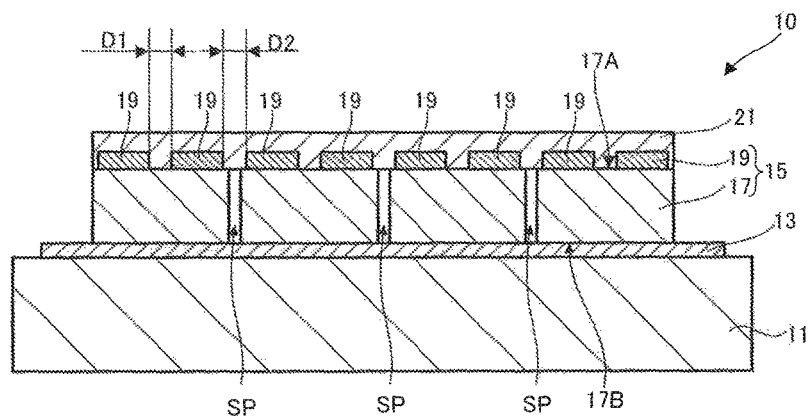
FIG. 1B is a cross-sectional view taken along line 1B-1B of FIG. 1A.

Now, with reference to FIGS. 1A and 1B, taking as an example a light-emitting device that employs LED elements, a description will be given of a light-emitting device 10 according to an embodiment of the present invention. A mounting substrate 11 has a rectangular planar shape. The mounting substrate 11 is formed of a semiconductor such as Si, a metal such as Cu, or an insulating material such as AlN and SiC.

A substrate bonding layer 13 serving as a bonding layer is a metal layer which has Ti, Pt, and Au layered in that order and thereby formed on the upper surface of the mounting substrate 11. The substrate bonding layer 13 has a plurality of rectangular bonding areas 13A spaced apart from each other and disposed in a row on the mounting substrate 11, connection areas 13B for electrically connecting between the bonding areas 13A, and pad areas 13C which are extended from the bonding areas 13A disposed at outermost positions. The bonding areas 13A have a longer side in a direction perpendicular to the direction of the arrangement. Note that in the drawing, the boundaries between the bonding areas 13A, the connection areas 13B, and the pad areas 13C are shown with broken lines.

A light-emitting unit 15 is disposed on each of the bonding areas 13A of the substrate bonding layer 13 on the mounting substrate 11. That is, the light-emitting units 15 are disposed in a row on the mounting substrate 11. The light-emitting unit 15 has a support 17, and a plurality of light-emitting elements 19 which are bonded to a top surface 17A of the support 17 and include a semiconductor structure layer (not illustrated) having a light-emitting layer (not illustrated). Note that by way of example, the drawing illustrates four light-emitting units 15 disposed in a row. However, the number of light-emitting units 15 may also be three or less or five or more. Furthermore, the light-emitting units 15 may also be arranged in two or more rows.

For example, the support 17 of each of the light-emitting units 15 is formed from an electrically conductive substrate such as Si. The support 17 has a quadrangular prism shape with a rectangular top surface (upper surface) 17A and a bottom surface (lower surface) 17B. Any adjacent supports 17 are disposed to be spaced apart from each other. That is, there is formed a space SP between the adjacent supports 17.

A lower surface electrode (not illustrated) is formed on the bottom surface 17B of the support 17 so as to cover the bottom surface 17B. The lower surface electrode has Ti, Pt, and Au layered in that order on the bottom surface 17B. For example, the lower surface electrode is bonded to the substrate bonding layer 13 by thermo-compression bonding. A plurality of light-emitting portions 19 which include a semiconductor structure layer (not illustrated) having a light-emitting layer (not illustrated) are formed on the top surface 17A of the support 17. In this embodiment, the light-emitting elements 19 are arranged, in two rows, six in each row, along the direction of arrangement parallel to the longitudinal direction of the upper surface of the support 17. That is, a plurality of light-emitting elements 19 are arranged in two rows in a direction perpendicular to the direction of arrangement of the light-emitting units 15.

Note that in this embodiment, the light-emitting elements 19 are formed by partitioning a semiconductor layer including a light-emitting layer formed or a growth substrate (not illustrated) such as of sapphire into a plurality of elements on the growth substrate, affixing the plurality of partitioned elements to the support 17, and then removing the growth substrate. That is, the light-emitting unit 15 is a monolithic light-emitting unit into which a plurality of light-emitting elements 19 and the support 17 are integrally formed. In other words, the light-emitting unit 15 has a thin film LED structure. Thus, the light-emitting elements 19 can be disposed in close proximity to each other on the support 17.

Furthermore, since the light-emitting elements 19 are formed in this manner, the light-emitting elements 19 can have a thickness of 10 μm or less, i.e., the thickness in a direction perpendicular to the upper surface of the support 17, thereby reducing the propagation of light waves to adjacent light-emitting elements 19.

In a direction perpendicular to the direction of arrangement of the light-emitting units 15. The light-emitting elements 19 are preferably arranged in as close proximity as possible to reduce dark lines occurring between the light-emitting element 19. On the other hand, in a direction along the direction of arrangement of the light-emitting units 15, the interval D1 between the adjacent light-emitting elements 19 within a light-emitting unit 15 is preferably set depending on the interval D2 between the light-emitting elements 19 that are adjacent to each other across the adjacent light-emitting units 15. More preferably, the interval D1 may be adjusted so that the interval D1 and the interval D2 are the same as much as possible.

The light-emitting elements 19 that are adjacent to each other across the adjacent light-emitting units 15 are difficult to dispose in closer proximity to each other than the light-emitting elements 19 adjacent to each other within one light-emitting unit 15 due to the accuracy of positioning of the supports 17. Thus, to allow the interval D1 and the interval D2 to coincide with each other, the interval D2 is set with reference to the interval D1 and then the light-emitting elements 19 are disposed on the support 17. By adjusting the interval D2 depending on the interval D1, it is possible to prevent the occurrence of variations in luminance within the light-emitting device 10.

Note that as a matter of course, the interval D1 between the light-emitting elements 19 may be set in advance on the light-emitting units 15, and then the positioning separation between the light-emitting units 15 may be accordingly adjusted so as to adjust, depending on the interval D1, the interval D2 of the light-emitting elements 19 that are adjacent to each other across the adjacent light-emitting units 15.

A phosphor layer 21 is formed on the support 17 so as to embed the light-emitting portions 19. That is, the phosphor layer 21 is continuously formed on a plurality of light-emitting units 15 across all the plurality of light-emitting units 15 disposed on the mounting substrate 11.

For example, the phosphor layer 21 may be a resin sheet that contains phosphor particles and light scattering materials. Examples of the phosphor particles used may include those such as Ce activated yttrium/aluminum/garnet (YAG:Ce), Ce activated terbium/aluminum/garnet (TAG:Ce), orthosilicate phosphor ((BaSrCa)SiO$_4$, etc.), and α sialon phosphor (for example, Ca-α-SiAlON:Eu), which are excited by blue light to emit yellow fluorescent light. For example, the light scattering materials are light scattering particles formed from TiO$_2$, SiO$_2$, ZnO, or Al$_2$O$_3$.

Note that the phosphor layer 21 may also be formed by applying a liquid resin or glass binder containing the phosphor particles and the light scattering materials onto the support 17 and then allowing the same to be cured, for example, by thermosetting. Furthermore, the phosphor layer 21 may also be a plate-shaped one that contains phosphor. Each light-emitting element 19 may also be allowed not to be embedded in the phosphor layer 21, so that the phosphor layer 21 is only placed on or over each light-emitting element 19.

Figure 2A:
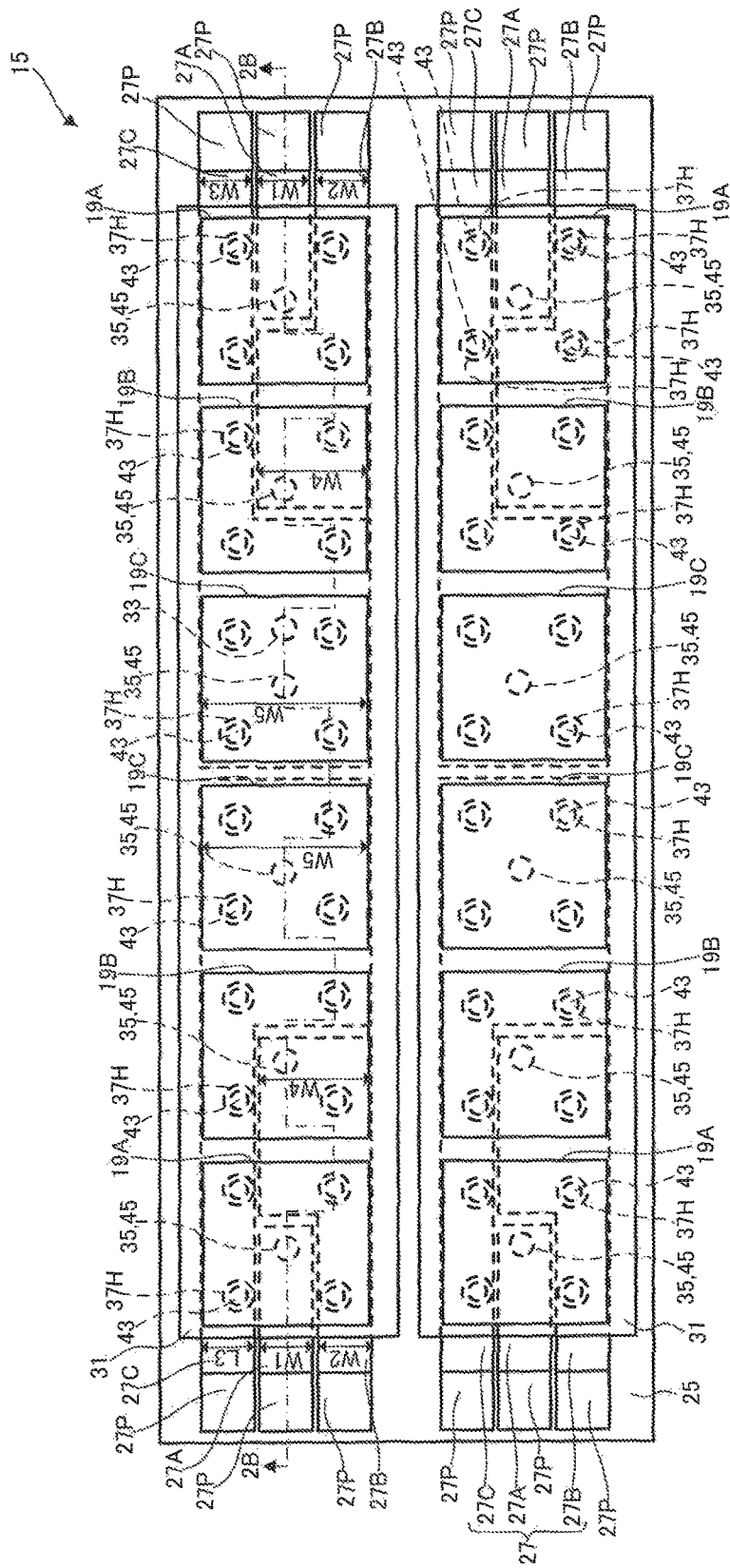
FIG. 2A is a top plan view illustrating a light-emitting unit.

FIG. 2A illustrates a top plan view of one light-emitting unit 15. For convenience of description, FIG. 2A shows the light-emitting elements 19 in a manner such that a light-emitting element 19A is disposed as a first one from an end of the support 17 in the longitudinal direction, a light-emitting element 19B is disposed as a second one from the end, and a light-emitting element 19C is disposed as a third one from the end.

Figure 2B:
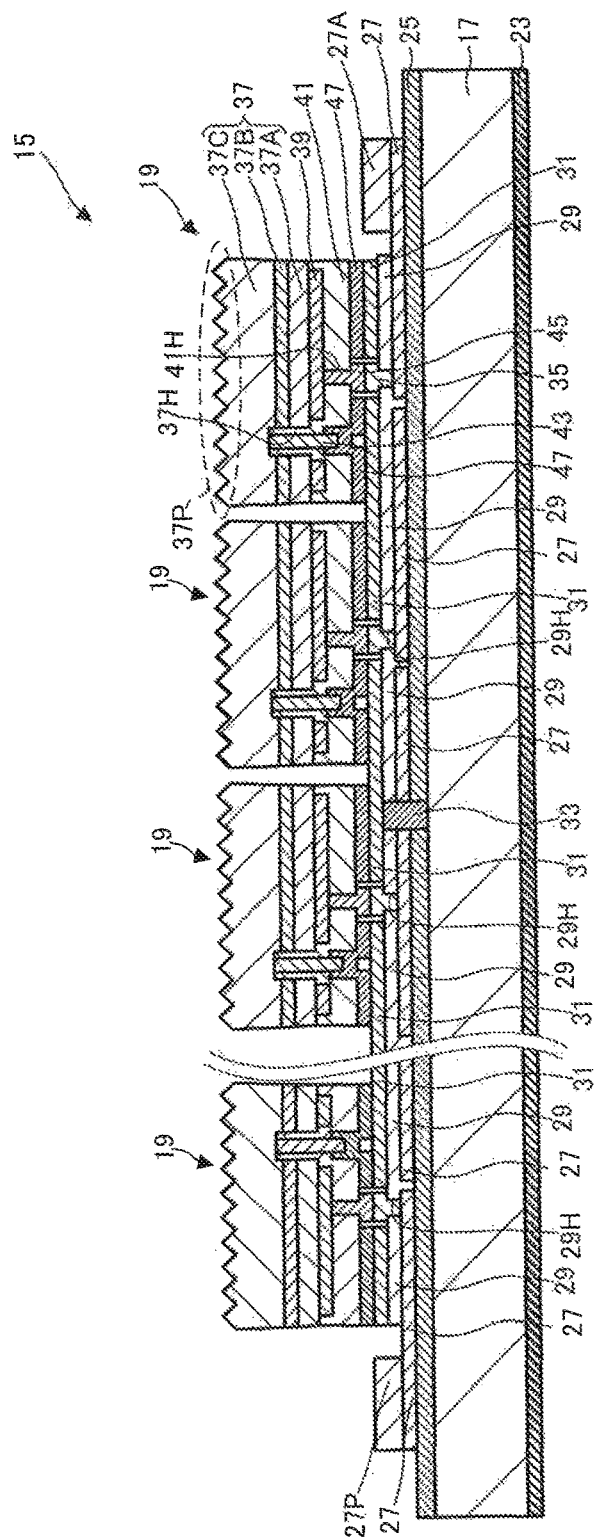
FIG. 2B is a cross-sectional view illustrating the light-emitting unit.

Furthermore, FIG. 2B illustrates a cross-sectional view taken along line 2B-2B of FIG. 2. In FIG. 2B, part of the light-emitting unit 15 is omitted for illustration.

As described above, the light-emitting units 15 are formed by partitioning the semiconductor layer formed on the growth substrate such as of sapphire (not illustrated) into a plurality of elements on the growth substrate; affixing the plurality of partitioned elements to the support 17; and then removing the growth substrate.

As shown in FIGS. 2A and 2B, the lower surface electrode 23 is formed on the surface of the support 17 opposite to the surface on which the light-emitting elements 19 are placed, that is, on the lower surface. For example, the lower surface electrode 23 is formed by layering Ti, Pt, and Au in that order from the surface of the support 17. Note that when an Si substrate is employed as the support 17, the thermal oxide film on the lower surface of the support 17 should be removed, for example, by grinding or wet-etching before the lower surface electrode 23 is formed.

The light-emitting units 15 are mounted on the mounting substrate 11, for example, by applying an AuSn paste to the position on the substrate bonding layer 13 at which the light-emitting unit 15 is to be mounted, and then placing the light-emitting unit 15 on the mounting substrate 11 so that the lower surface electrode 23 is brought onto the AuSn paste. After that, the substrate bonding layer 13 and the lower surface electrode 23 are bonded together by heating.

On the upper surface of the support 17, an upper surface insulating layer 25 which is formed of an insulating material such as $SiO_2$ as a first insulating layer is formed. Note that when the support 17 is an Si substrate, the upper surface insulating layer 25 may also be a thermal oxide film formed on the surface of the Si substrate.

An individual conductor trace portion 27 is formed on the upper surface insulating layer 25. The individual conductor 4 trace portion 27, serving as a conductor trace portion, includes a plurality of individual conductor traces 27A to 27C which are formed of an electrical conductor such as Au and which are formed to be spaced apart from each other. The individual conductor trace portion 27 is formed for each row of the three light-emitting element 19A to 19C. For the light-emitting elements 19A to 19C, the individual conductor traces 27A to 27C serving as conductor traces are formed from each end portion of the upper surface of the support 17 in the longitudinal direction so as to extend to a region immediately below each of the light-emitting elements 19A to 19C, respectively. The individual conductor trace 27A extends to a region immediately below the light-emitting element 19A, the individual conductor trace 27B extends to a region immediately below the light-emitting element 19B, and the individual conductor trace 27C extends to a region immediately below the light-emitting element 19C.

That is, the plurality of individual conductor traces 27A to 27C have one end that is exposed at an end of the upper surface of the support 17 in the longitudinal direction and the other end that is disposed under each of the light-emitting elements 19A to 19C. The one end of each of the individual conductor traces 27A to 27C that is exposed is provided with an individual conductor trace pad 27P which is formed from a conductor such as Au and which can be electrically connected to outside, for example, by wire bonding.

Furthermore, the individual conductor traces 27A to 27C are electrically connected to the light-emitting elements 19A to 19C at the other ends disposed under the light-emitting elements 19A to 19C, respectively. That is, it is possible to supply power from outside to the light-emitting elements 19A to 19C through the respective individual conductor traces 27A to 27C.

At the one end where the individual conductor trace pads 27P are formed, the individual conductor traces 27A to 27C have the same length along a direction perpendicular to the direction of arrangement of the light-emitting elements 19A to 19C in an in-plane direction of the upper surface of the support 17 (hereafter to be also referred to as the trace width direction). That is, the individual conductor traces 27A to 27C have the same trace width in the direction of extension of the individual conductor traces 27A to 27C at the one end where the individual conductor trace pads 27P are formed.

Let W1, W2, and W3 be the trace widths of the respective individual conductor traces 27A to 27C connected to the light-emitting elements 19A, 19B, and 19C at the one ends where the individual conductor trace pads 27P are formed (W1=W2=W3).

Each of the individual conductor traces 27A is terminated at a region immediately below the light-emitting elements 19A that are disposed at both ends with the trace width W1 unchanged.

Each of the individual conductor traces 27B connected to the light-emitting elements 19B disposed as the second ones From both ends in the longitudinal direction of the support 17 is changed halfway therebetween in trace width and then terminated at a region immediately below the light-emitting elements 19B. The trace width W2 of each of the individual conductor traces 27B is not changed in a region where the traces 27B are disposed side by side with the individual conductor traces 27A in the direction of extension, i.e., in the trace width direction.

When the individual conductor trace 27A is terminated at a region immediately below the light-emitting element 19A, each individual conductor trace 27B is increased in the trace width until a region on the extension line of the individual conductor trace 27A is reached, so that the trace width is W4 (>W2). That is, the trace width is increased generally by the same width as the trace width W1.

In other words, the individual conductor trace 27B is configured such that the trace width W4 in a region below the light-emitting element 19B to which the individual conductor trace 27B is electrically connected is greater than the trace width W2 in a region extending side by side with the individual conductor trace 27A in the direction of extension.

Each of the individual conductor traces 27C connected to the light-emitting elements 19C disposed as the third ones from both ends of the support 17 in the longitudinal direction is changed halfway therebetween in width. The trace width W3 of each of the individual conductor traces 27C is not changed in a region where the traces 27B are disposed side by side with the individual conductor traces 27B in the direction of extension, i.e., in the trace width direction. When the individual conductor traces 27B are terminated at a region immediately below the light-emitting elements 19B, each of the individual conductor traces 27C is increased in trace width to a region on the extension line of the individual conductor traces 27B, so that the trace width is W5 (>W4). That is, the trace width is increased generally by the same width as the trace width of W4.

In other words, the individual conductor trace 27C is configured such that the trace width W5 under the region of the light-emitting element 19C to which the individual conductor trace 27C is electrically connected is greater than the trace width W3 in a region extending side by side with the individual conductor trace 27B in the direction of extension.

That is, the trace width of the individual conductor traces 27B and 27C in the direction of extension in a region under one light-emitting element to which the corresponding one of the individual conductor traces 27B and 27C is electrically connected is greater than the trace width in a region extending in the direction of extension side by side with the conductor trace connected to a light-emitting element that is disposed closer to the one end portion, at which the individual conductor trace pads 27P of the individual conductor traces 27A to 27C are formed, than the one light-emitting element is. Furthermore, when viewed from both the end portions of the support 17 in the longitudinal direction, the trace widths of the individual conductor trace 27B and the individual conductor trace 27C are increased in trace width in a region under the light-emitting elements 19A and 19B each disposed before the light-emitting elements 19B and 19C to which the respective conductor traces 27B and 27C are connected.

As described above, the individual conductor traces 27B and 27C have an elongated length because the traces are connected to the light-emitting elements 19B and 19C that are distant from individual conductor trace pads 27P to which electric current is injected from outside. The trace widths of the individual conductor traces 27B and 27C are thus increased from a certain midpoint onward. This makes it possible to reduce the resistance of the conductor traces to the light-emitting elements 19B and 19C. This, in turn, makes it also possible to reduce the drive voltage of the light-emitting elements 19B and 19C and the power consumption of the light-emitting device 10 as a whole when being driven.

An interlayer insulating layer 29 serving as a second insulating layer of an insulating material such as $SiO_2$ is formed on the upper surface insulating layer 25 and the individual conductor trace 27. The interlayer insulating layer 29 has an opening 29H formed in a region immediately below each of the light-emitting elements 19, so that part of the upper surface of the individual conductor trace 27 is exposed via the opening 29H. Furthermore, the interlayer insulating layer 29 is not formed on the individual conductor trace pads 27P. That is, the interlayer insulating layer 29 is formed so as to cover the individual conductor trace 27 on the upper surface insulating layer 25 while exposing the individual conductor trace pads 27P and partially exposing the upper surface of the individual conductor trace 27 in a region immediately below the light-emitting elements 19.

A layered common conductor trace 31 that is formed from an electrical conductor such as Au and electrically connected in common to each light-emitting element 19 is formed on the interlayer insulating layer 29. The common conductor trace 31 is formed to avoid the opening 29H. That is, the opening 29H and the peripheral area thereof are exposed from the common conductor trace 31.

A through conductor trace 33 is formed from an electrical conductor such as Au in contact with the surface of the support 17 in a region under one light-emitting element 19 (in the drawing, the third light-emitting element from the right) and penetrates the upper surface insulating layer 25 and the interlayer insulating layer 29 to the upper surface of the interlayer insulating layer 29. That is, the through conductor trace 33 is in contact with the support 17 and the common conductor trace 31 and electrically connects therebetween. Note that two or more through conductor traces 33 may be formed, and may also be formed in regions under two or more light-emitting elements 19.

An individual electrode 35 formed from a conductor such as Au is formed on the upper surface of the individual conductor trace 27 exposed from the opening 29H. Each individual electrode 35 is formed, for example, to be spaced apart from the common conductor trace 31, thereby being electrically insulated from the common conductor trace 31. Each individual electrode 35 is provided to be disposed in a central region of the light-emitting element 19 when each is viewed in a direction perpendicular to the upper surface of the support 17 (hereafter also referred to as "in a top plan view").

The light-emitting elements 19 are provided on the support 17 while being bonded to the common conductor trace 31 and the individual electrode 35. The light-emitting element 19 has a semiconductor structure layer 37 which has a p-type semiconductor layer 37A, a light-emitting layer 37B, and an n-type semiconductor layer 37C layered from the support 17 side in that order. The semiconductor structure layer 37 has, for example, a composition of $Al_xIn_yGa_{1-x-y}N$ ($0 \le x \le 1$, $0 \le y \le 1$).

The semiconductor structure layer 37 has a through hole 37H formed to penetrate from the surface of the semiconductor structure layer 37 on the support side, that is, from the surface of the p-type semiconducter layer 37A through the p-type semiconductor layer 37A and the light-emitting layer 37B into the h-type semiconductor layer 37C. In a top plan view, the through holes 37H are formed, one at each of the four corners of the light-emitting element 19, when viewed from the individual electrode 35. In other words, in a top plan view, the through holes 37H are provided in a manner such that two through holes sandwich the individual electrode 35 along both the diagonal lines of the light-emitting element 19. That is, in a top plan view, the four through holes 37H are formed so as to surround the individual electrode 35.

Conical projections 37P (in the drawing, the structure within a broken line) are formed on the surface of the n-type semiconductor layer 37C in order to efficiently emit the outgoing light from the light-emitting layer 37B to outside from the surface of the n-type semiconductor layer 37C. The conical projection 37P may also be formed by soaking the surface of the n-type semiconductor layer 37C, for example, in an alkaline solution such as a TMAH solution and then forming, on the surface of the n-type semiconductor layer 37C, a recessed and projected structure derived from the semiconductor crystalline structure. Note that the conical projection 37P is not always required to be provided.

A p contact electrode 39 which has, for example, Ag and TiW layered in that order from the surface of the p-type semiconductor layer 37A is formed on the surface. The p contact electrode 39 is not formed on the peripheral edge region of the through hole 37H on the surface of the p-type semiconductor layer 37A and on the end region of the surface of the p-type semiconductor layer 37A. That is, the peripheral edge region of the through hole 37H and the end region of the surface of the p-type semiconductor layer 37A are exposed from the p contact electrode 39.

An insulating layer 41 is formed so as to cover the p-type semiconductor layer 37A, the p contact electrode 39, and the side of the through hole 37H. That is, at the bottom of the through hole 37H, the n-type semiconductor layer 37C is exposed from the insulating layer 41. Furthermore, the insulating layer 41 has a through hole 41H formed from the surface of the insulating layer 41 so as to reach the p contact electrode 39. That is, part of the p contact electrode 39 is exposed from the insulating layer 41 via the through hole 41H.

An n contact electrode 43 of a metal material is formed inside the through hole 41H while being in contact with the surface of the n-type semiconductor layer 37C exposed from the insulating layer 41. For example, the n contact electrode 43 is formed to be protruded from the surface of the insulating layer 41.

A p electrode 45 is formed in the through hole 41H while being in contact with the surface of the p contact electrode 39 exposed from the insulating layer 4. The p electrode 45 is formed by layering Ti, Pt, and Au in that order from the surface of the p contact electrode 39. The p electrode 45 is formed to protrude from the insulating layer 41.

An n electrode 47 is formed on the surface of the insulating layer 41. The n electrode 47 is formed by layering Ti, Pt, and Au in that order from the surface of the insulating layer 41. The n electrode 47 is formed to be spaced apart from the p electrode 45.

The p electrode 45 and the n electrode 47 are bonded, for example, by thermo-compression in a vacuum to the individual electrode 35 and the common conductor trace 31 formed on the support 17, respectively. That is, the individual electrode 35 and the p electrode 45 are electrically connected to each other, and the common conductor trace 31 and the n electrode 47 are electrically connected to each other. Thus, the light-emitting elements 19 are electrically connected in parallel to each other between a pad portion 13A of the substrate bonding layer 13 and the individual conductor trace pad 27P. Thus, each of the light-emitting elements 19 can be individually driven by turning on or off the power supply to each of the individual conductor trace pads 27P.

Note that in a region immediately below the through hole 37H, the n electrode 47 is recessed toward the through hole 37H. Furthermore, above the gap between the individual conductor traces 27A to 27C, the surface of the interlayer insulating layer 29 may often be recessed toward the support 17, thereby causing the surface of the common conductor trace 31 formed thereon to be also recessed.

Such recesses overlapping in a direction perpendicular to the upper surface of the support 17 may communicate with outside to reduce the reliability of mechanical strength of the light-emitting elements 19. Thus, the light-emitting units 15 may preferably be formed in a manner such that a gap between the individual conductor traces 27A to 27C may not be located in a region immediately below the through hole 37H.

As described above, the light-emitting elements 19 are formed by being affixed onto the support 17. Thus, in the light-emitting unit 15, the light-emitting elements 19 can be disposed with a very small interval therebetween on the support 17. This makes it possible to reduce the occurrence of dark lines to be otherwise formed between the adjacent light-emitting elements 19.

In the aforementioned embodiment, according to the light emitting units 15 and the light-emitting device 10 including the light-emitting units 15, the individual conductor traces 27B and 27C have an elongated length because the traces are connected to the light-emitting elements 19B and 19C that are distant from the individual conductor trace pads 27P to which electric current is injected from outside the light-emitting unit 15. The trace widths of the traces are thus partially increased from a certain midpoint onward. This makes it possible to reduce the resistance of the conductor trace to the light-emitting elements 19B and 19C. This, in turn, makes it also possible to reduce the drive voltage of the light-emitting elements 19B and 19C and the power consumption of the light-emitting device 10 as a whole when being driven.

Furthermore, according to the light-emitting device 10 of the aforementioned embodiment, one light-emitting device is formed by arranging a plurality of light-emitting units 15 including the supports 17 on each of which a plurality of light-emitting elements 19 are formed. That is, in the light-emitting device 10 of the aforementioned embodiment, one light-emitting device is not formed by one light-emitting unit 15 having a required number of light-emitting elements, but a plurality of independent light-emitting units 15 are arranged to form a light-emitting device having a required number of light-emitting elements.

When one light-emitting unit forms one light-emitting device, in the case where there is a defect in the light-emitting unit and where there is a defect in part of the light-emitting unit, it is necessary to replace the light-emitting unit that holds the number of light-emitting elements required for the light-emitting device. In contrast to this, when a plurality of light-emitting units 15 are arranged to form a light-emitting device just like the light-emitting device 10 of the aforementioned embodiment, only a light-emitting unit 15 that includes the defect may be replaced, thereby enabling the yield of the light-emitting device 10 to be improved.

Furthermore, in the light-emitting device 10 of the aforementioned embodiment, the space SP (see FIG. 1) is formed between the supports 17 of the respective adjacent light-emitting units 15. The light that is emitted from the light-emitting element 19 of one light-emitting unit 15 and then propagates through the phosphor layer 21 so as to be directed toward a light-emitting unit 15 adjacent to the one light-emitting unit 15 may go into the space SP between the adjacent supports 17 and would be then attenuated to such an extent that almost no light may come out of the space SP.

It is thus possible to prevent the light emitted from the light-emitting elements 19 of one light-emitting unit 15 from propagating through the phosphor layer 21 and being leaked to the adjacent light-emitting unit 15. In particular, when the light-emitting device 10 is used, for example, for an adaptive driving beam (ADB), in individually driving the light-emitting elements 19, it is possible to reduce leakage of light to adjacent light-emitting units 15, that is, the so-called light crosstalk.

Furthermore, in the present invention, the thickness of the light-emitting elements 19 can be made 10 µm or less. It is thus possible to reduce light emission from the sidewall of the light-emitting element 19, thereby further reducing the crosstalk into adjacent elements.

Furthermore, as described above, the light-emitting device 10 is configured such that a plurality of mutually independent light-emitting units 15 are arranged to form a light-emitting device having a required number of light-emitting elements 19. That is, a required number of light-emitting elements 19 for the light-emitting device 10 are provided by being distributed on a plurality of supports 17 that are disposed by being spaced apart from each other. As compared with the case where all the light-emitting elements required for the light-emitting device are disposed on one support, reducing the size of the planar shape of each support as described above enables to prevent damage such as cracks that may otherwise occur in the supports due to the difference in thermal expansion coefficient between the mounting substrate and the supports.

Furthermore, as described above, in the light-emitting device 10, the light-emitting elements 19 can be disposed in extremely close proximity to each other in a direction perpendicular to the direction of arrangement of the light-emitting units 15. Thus, almost no dark lines caused by gaps between the light-emitting elements 19 may occur in the direction perpendicular to the direction of arrangement of the light-emitting units.

Therefore, in the case of reducing dark lines in an irradiation beam by an optical system such as a lens to be disposed in the direction of irradiation of the light-emitting device 10, the optical system can be designed by taking into account only those dark lines that may occur in a direction along the direction of arrangement of the light-emitting units 15. Thus, it is possible to simplify the structure of the optical system that is provided for the light-emitting device 10.

Figure 3:
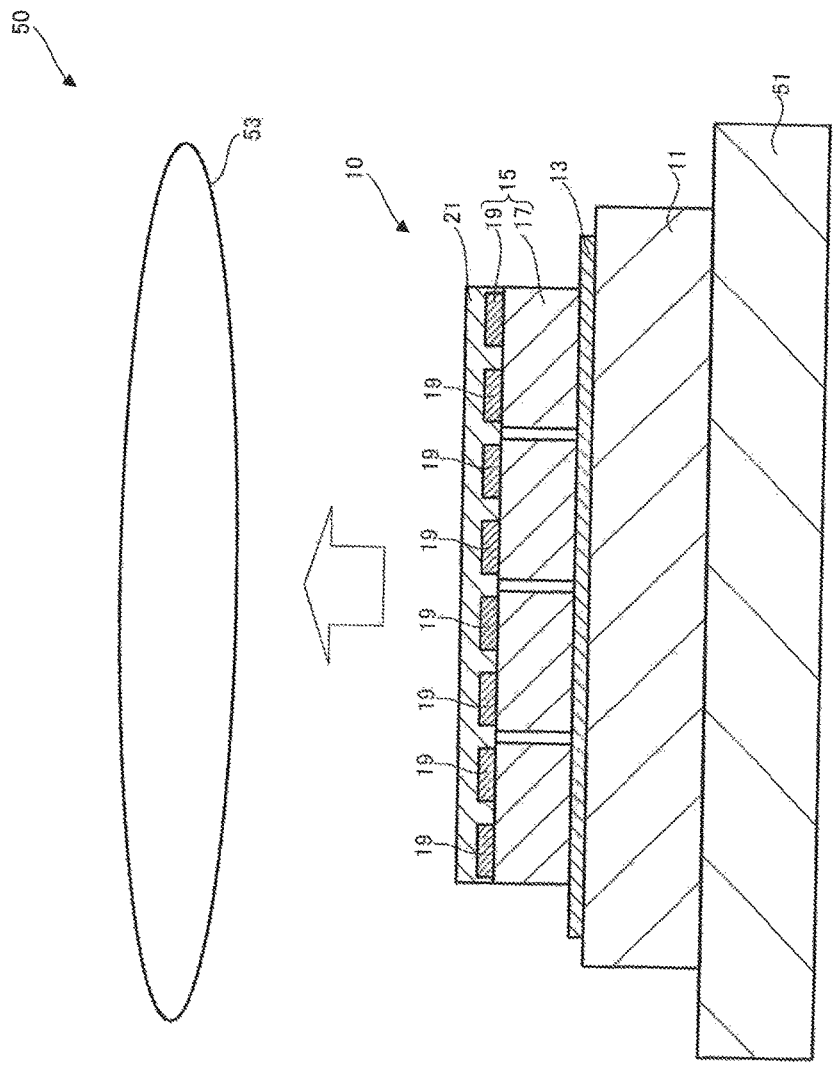
FIG. 3 is a view illustrating an example of a lighting unit which employs a light-emitting device.

FIG. 3 illustrates a lighting unit 50 as an example of lighting apparatuses that employ the light-emitting device 10. The lighting unit 50 is configured such that the mounting substrate 11 is bonded onto the surface of a metal substrate 51 to thereby secure the light-emitting device 10 onto the metal substrate 51. Furthermore, in the direction of light emission of the light-emitting device 10 (in the drawing, shown by hollow arrow), a lens 53 is provided at a position opposed to the upper surface of the phosphor layer 21. Note that the metal substrate 51 may also be provided with a structure for facilitating heat dissipation such as heat dissipating fins which are integrated with the metal substrate 51 or formed separately from the metal substrate.

As described above, in trying reducing dark lines in the irradiation beams from the light-emitting device 10, it is necessary to take into account only those dark lines that may occur in the direction of arrangement of the light-emitting units 15. Thus, the lens 53 may be configured such that only in the direction of arrangement of the light-emitting units 15, for example, such a cyclic structure may be formed which allows a plurality of cylindrical lenses to be arranged so as to mutually superpose those images provided by light emitted from the light-emitting elements.

That is, in a direction perpendicular to the direction of arrangement of the light-emitting units 15, it is not always necessary to provide a structure for reducing dark lines. Thus, use of the light-emitting device 10 will enable a lens having a simplified structure to be employed as the lens 53.

Modified Example 1

Figure 4:
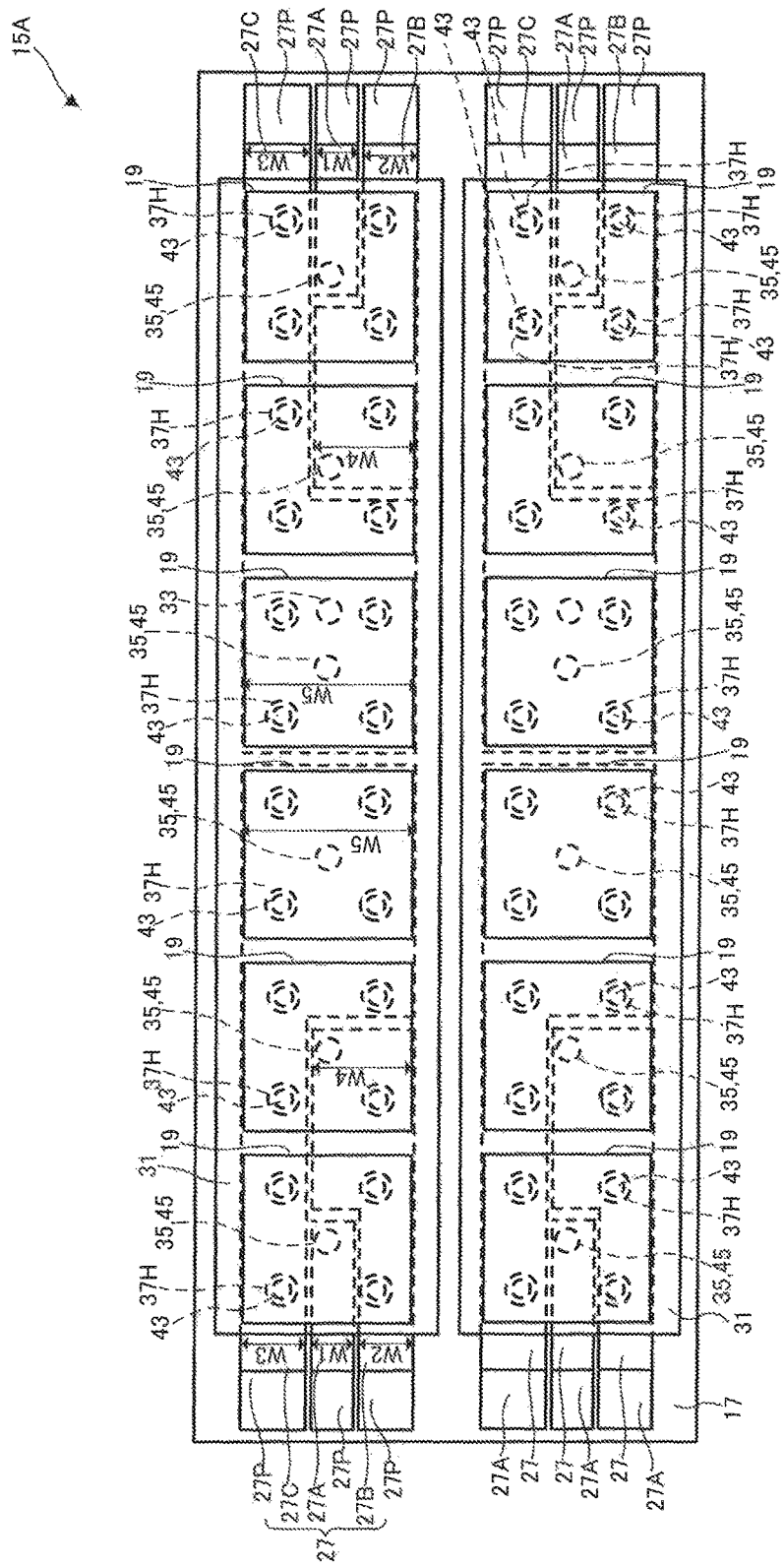
FIG. 4 is a top plan view illustrating a light-emitting unit according to a modified example.

A description will next be given of an example in which the trace widths of the end portions at which the individual conductor trace pads 27P are formed are different from each other for the individual conductor traces 27A to 27C. FIG. 4 is a top plan view illustrating light-emitting units 15A for a light-emitting device 10 according to Modified Example 1.

The light-emitting unit 15A of the light-emitting device according to Modified Example 1 is configured in the same manner as the light-emitting unit 15 according to the aforementioned embodiment except that the trace widths of the individual conductor traces 27A to 27C are different from these of the light-emitting unit 15 according to the aforementioned embodiment.

The light-emitting unit 15A of Modified Example 1 is configured such that at the end portions at which the individual conductor trace pads 27P are formed, the trace width W1 of the individual conductor trace 27A connected to the light-emitting element 19A that is disposed at the nearest position from the individual conductor trace pad 27P is the smallest. On the other hand, the trace width W3 of the individual conductor trace 27C connected to the light-emitting element 19C that is disposed at the farthest position from the individual conductor trace pad 27P is the largest. That is, the trace widths of the individual conductor traces 27A to 27C at the end portions at which the individual conductor trace pads 27P are formed are such that W1<W2<W3.

That is, the individual conductor traces 27A to 27C connected those light-emitting elements that are spaced apart farther from one end portion of the row of arranged light-emitting elements 19, that is, the one end portion at which the individual conductor trace pads 27P of the individual conductor traces 27A to 27C are formed have a greater trace width before the trace width is increased.

This allows the conductor trace resistance per unit distance to be reduced by a greater amount for the individual conductor traces 27A to 27C having a longer conductor trace distance. It is thus possible to equalize the drive voltages of the light-emitting elements 19A to 19C. Furthermore, by reducing the drive voltage of the light-emitting elements 19C, it is possible to reduce the drive voltage and power consumption of the light-emitting unit 15 as a whole and the light-emitting device 10 as a whole.

Another Modified Example

In the aforementioned embodiment, such a case has been illustrated and explained in which the individual conductor trace portion 27 is formed only immediately below the light-emitting elements 19. However, like the light-emitting unit 15B shown in FIG. 5, the individual conductor trace portion 27 may also be expanded as a whole to a region between the rows of the light-emitting elements 19 on the support 17. This allows the trace widths of the individual conductor traces 27A to 27C to be further increased, thereby further reducing the resistance of the conductor traces.

Figure 5:
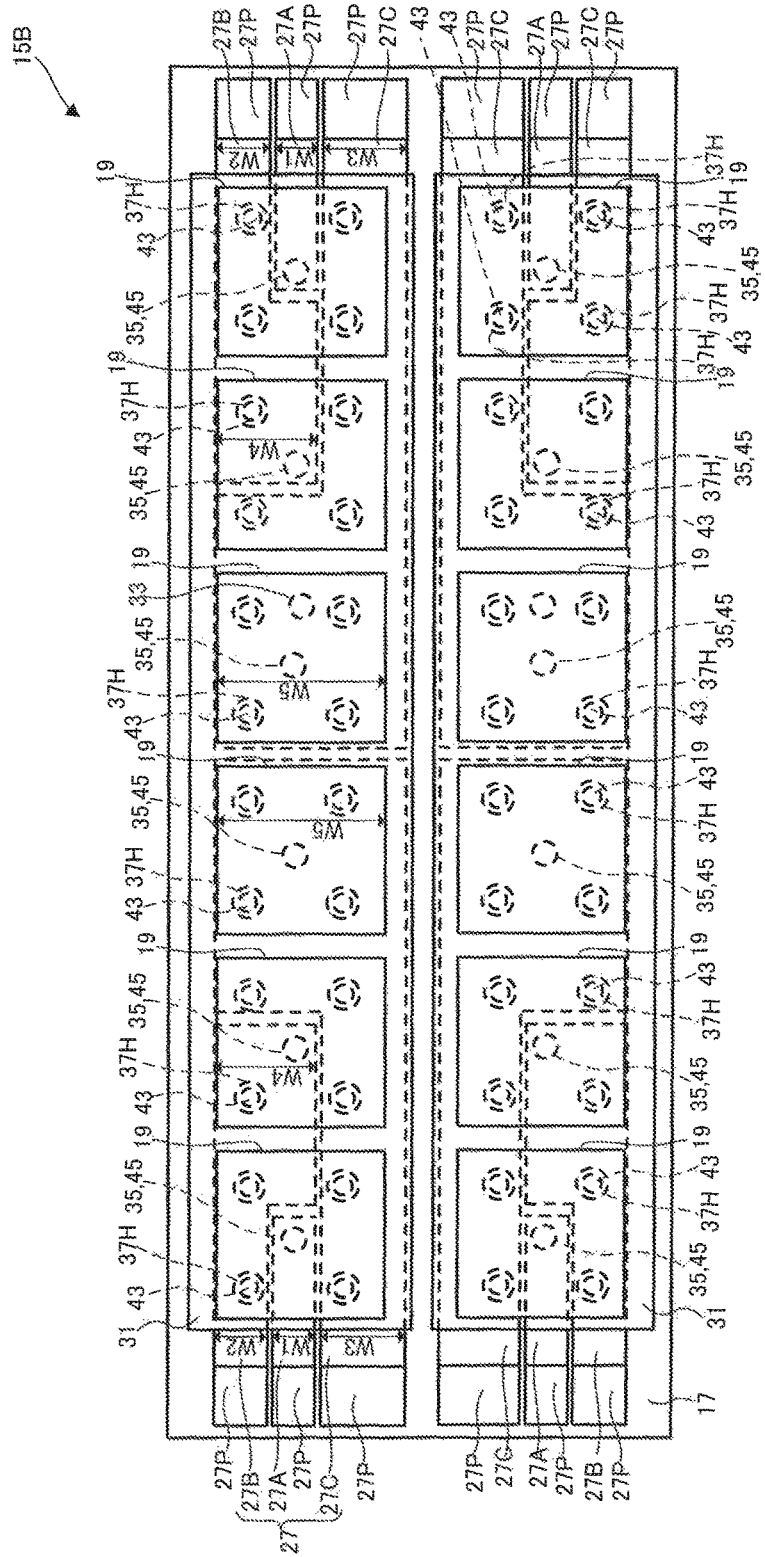
FIG. 5 is a top plan view illustrating a light-emitting unit according to a modified example.

Note that in FIG. 5, as in Modified Example 1, the widths of the individual conductor traces 27A to 27C are illustrated so that W1<W2<W3 at the end portions where the individual conductor trace pads 27P are formed. However, it is also acceptable that at the end portions where the individual conductor trace pads 27P are formed as in the first embodiment, the widths of the individual conductor traces 27A to 27C may also be defined so that W1=W2=W3.

Furthermore, as described above, in the light-emitting unit 15, the individual conductor traces 27A to 27C are preferably formed in a manner such that the gaps between the individual conductor traces 27A to 27C are not located at a region immediately below the through hole 37H.

Figure 6:
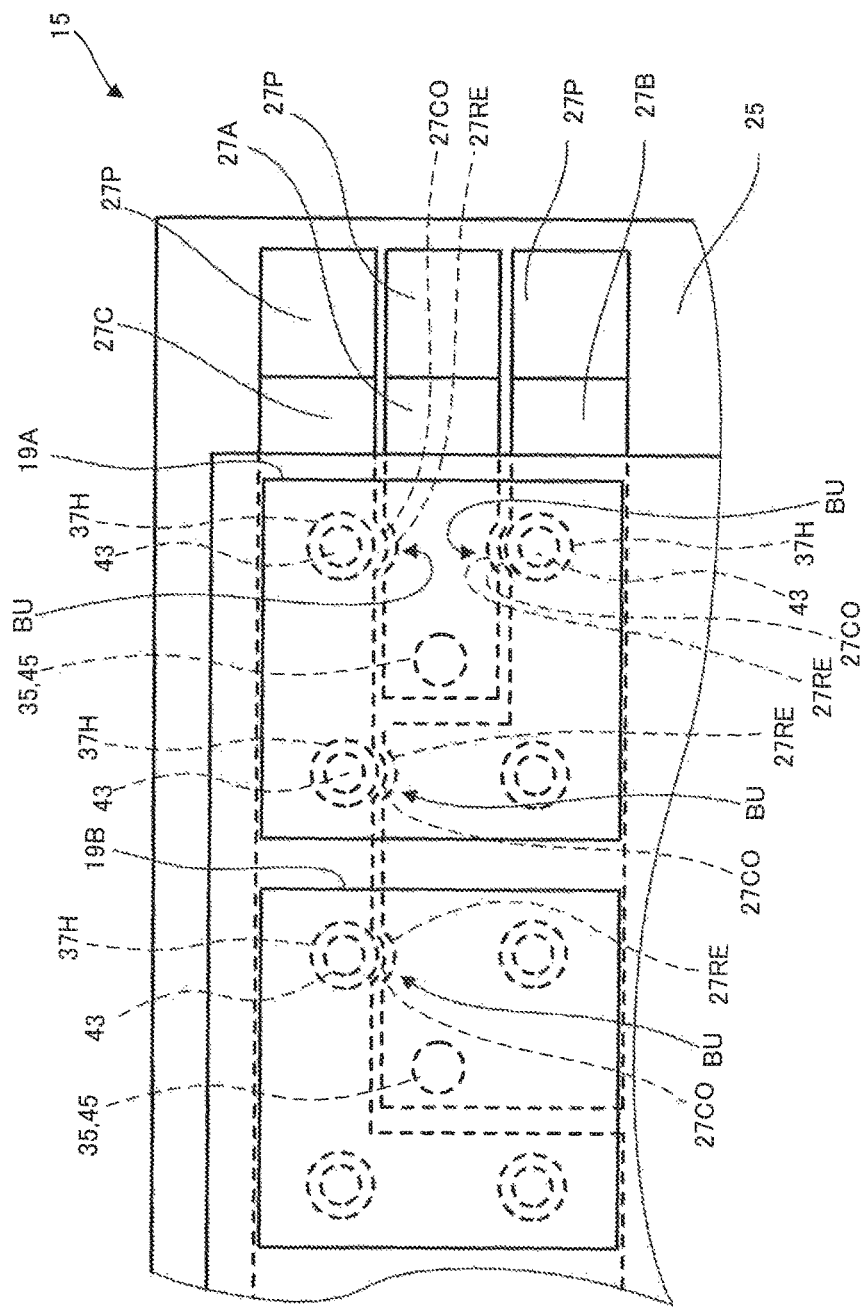
FIG. 6 is an enlarged top plan view illustrating a light-emitting unit according to a modified example.

FIG. 6 illustrates an enlarged top plan view of an example of the light-emitting unit 15 having the individual conductor traces 27A to 27C formed for the gaps between the individual conductor traces 27A to 27C to avoid the through hole 37H. In FIG. 6, the vicinity of the conductor trace pads 27P is enlarged.

As shown in FIG. 6, around a region immediately below the through hole 37H, there may also be formed a bulge BU that is curved and expanded in an in-plane direction on the upper surface of the upper surface insulating layer 25 in a manner such that the gaps between the individual conductor traces 27A to 27C avoid the region immediately below the through hole 37H. This enables the individual conductor traces 27A to 27C to be formed so that the gaps between the individual conductor traces 27A to 27C can avoid the region immediately below the through hole 37H.

The bulge BU is configured from a projected portion 27CO that is formed on one of the individual conductor traces adjacent to each other with a gap therebetween and a recessed portion 27RE formed on the other. Note that the bulge BU may preferably be formed to be projected toward inside the individual conductor trace 27A in a region where the individual conductor traces 27A to 27C are disposed side by side before the individual conductor trace 27A is terminated. On the other hand, in a region where the individual conductor trace 27A is terminated and the individual conductor traces 27B and 27C are disposed side by side, the bulge BU may preferably be formed so as to be projected toward inside the individual conductor trace 27B.

That is, the bulge BU of the gaps between the individual conductor traces disposed side by side is preferably formed so as to be projected toward inside the individual conductor trace connected to a light-emitting element that is closer to the conductor trace pads 27P. In other words, the bulge BU is preferably formed by the recessed portion 27RE of the individual conductor trace connected to a light-emitting element closer to the conductor trace pad 27P and the projected portion 27CO of the individual conductor trace connected to a light-emitting element farther therefrom.

Example of Positioning of Light-Emitting Elements

In the aforementioned embodiment, such a case has been illustrated and explained in which in one light-emitting unit 15, the light-emitting elements 19 of the same size are disposed, six in each of two rows, on the support 17. However, another arrangement of the light-emitting elements 19 is also possible. For example, the light-emitting elements 19 may also be arranged in one row or three or more rows in a direction perpendicular to the direction of arrangement of the light-emitting units 15. Furthermore, each of the light-emitting elements 19 may have a different size. For example, the light-emitting elements 19 may also have mutually different element lengths in a direction perpendicular to the direction of arrangement of the light-emitting units 15.

In the aforementioned embodiment, a description was given of an example in which the light-emitting elements 19 are individually driven. However, the conductor traces may be modified as appropriate, thereby providing a drive method for light-emitting elements as drive for individual ones, or drive for the entire ones or for each group of the light-emitting elements 19.

Furthermore, in the aforementioned embodiment, a description was given of an example in which the light-emitting elements 19 are LED elements. However, the light-emitting elements 19 may also be another light-emitting element such as a vertical resonator type light-emitting diode.

Note that in the aforementioned embodiment, a description was given of an example in which the phosphor layer 21 is continuously formed across all the light-emitting units 15. However, the invention is not limited thereto. For example, the phosphor layer 21 may also be intermittently formed by forming the phosphor layer 21 for each light-emitting unit, for each row in the light-emitting unit, and for each light-emitting element. Furthermore, in this case, light shielding may also be implemented by embedding, for example, white resin or black resin in the gaps between the phosphor layers 21 that are independently formed. This makes it possible to reduce the leakage of light propagating through the phosphor layer 21 to the region of an adjacent light-emitting element 19, i.e., the so-called light crosstalk.

In the aforementioned embodiment, the configuration of the semiconductor structure layer or the configuration of the metal layer, such as various numerical values, sizes, and materials, is only illustrative, and may be selected, as appropriate, depending on use and semiconductor elements to be manufactured.

What is claimed is:

1. A light-emitting device comprising:
   a support;
   an insulating layer formed on said support;
   first and second light-emitting elements mounted on said insulating layer and juxtaposed consecutively in a first direction on said insulating layer, said first and second light-emitting elements neighboring each other; and
   first and second conductor traces extending between said support and said insulating layer in said first direction,
   wherein said insulating layer has openings in areas underlying said first and second light-emitting elements through which each of said first and second conductor traces electrically connects to a corresponding one of said first and second light-emitting elements,
   wherein said first conductor trace extends in said first direction and is terminated at a region underlying said first light-emitting element, said second conductor trace extends in said first direction and is terminated at a region underlying said second light-emitting element, said first and second conductor traces extend side by side at the region underlying said first light-emitting element, and said second conductor trace extends into a region overlapping an extension line of the first conductive trace, part of the region being under said first light-emitting element, and
   wherein a trace width of said second conductor trace increases in the region overlapping the extension line of the first conductive trace, and a trace width of said second conductor trace in the region underlying said second light emitting element is greater than a trace width of said second conductor trace in the region where said first and second conductor traces extend side by side.

2. The light-emitting device according to claim 1, wherein the trace width of said second conductor trace in the region underlying said second light emitting element is larger than that of said first conductor trace in the region where said first and second traces extend side by side.

3. A light-emitting device, comprising:
   a mounting substrate;
   a plurality of supports mounted on said mounting substrate and juxtaposed in a first direction on said mounting substrate;
   insulating layers each formed on each of said supports;
   a plurality of light-emitting elements mounted and juxtaposed on each of said insulating layers, said plurality of light emitting elements comprising first and second light-emitting elements juxtaposed in a second direction orthogonal to said first direction and neighboring each other; and
   conductor trace portions each having a first and a second conductor trace, said first and second conductor traces extending between each of said supports and each of said insulating layers in said first direction,
   wherein on each of said supports, each of said insulating layers has openings in areas underlying said first and second light-emitting elements through which each of said first and second conductor traces electrically connects to a corresponding one of said first and second light-emitting elements:
   wherein, on each of said supports, said first conductor trace extends in said second direction and is terminated at a region underlying said first light-emitting element, said second conductor trace extends in said second direction and is terminated at a region underlying said second light-emitting element, said first and second conductor traces extend side by side at the region underlying said first light-emitting element, and said second conductor trace extends into a region overlapping an extension line of the first conductive trace, part of the region being under said first light-emitting element, and
   wherein a trace width of said second conductor trace increases in the region overlapping the extension line of the first conductive trace, and a trace width of said second conductor trace in the region underlying said second light emitting element is greater than a trace width of said second conductor trace in the region where said first and second conductor traces extend side by side.

4. The light-emitting device according to claim 3, wherein the plurality of light-emitting elements are disposed in plurality in said first direction on one of the supports, and light-emitting elements adjacent to each other on the one of the supports are disposed in the first direction at intervals equal to intervals between light-emitting elements adjacent to each other on adjacent supports.

5. The light-emitting device according to claim 3, wherein the plurality of light-emitting elements on one of the supports are connected electrically in parallel to each other.

6. The light-emitting device according to claim 3, further comprising a phosphor layer which is continuously formed on the light-emitting elements across all of the plurality of light-emitting elements on at least one of the supports.

7. The light-emitting device according to claim 1, further comprising additional light-emitting elements juxtaposed to each of said first and second light-emitting elements in a direction orthogonal to said first direction,
wherein said first and second conductor traces extend from a region underlying said first and second light-emitting elements to a region between said first and second light-emitting elements and said additional light-emitting elements.

8. The light-emitting device according to claim 1, further comprising:
third and fourth light-emitting elements juxtaposed consecutively in a second direction opposite to said first direction on said insulating layer, said third and fourth light-emitting element neighboring each other; and
third and fourth conductor traces which extend between said support and said insulating layer in the first direction,
wherein said insulating layer has openings in areas underlying said third and fourth light-emitting elements, and each of said third and fourth conductor traces electrically connects to a corresponding one of said third and fourth light-emitting elements through said openings of said insulating layer, and
wherein said third conductor trace extends in said second direction and is terminated at a region underlying said third light-emitting element, said fourth conductor trace extends in said second direction and is terminated at a region underlying said fourth light-emitting element, said third and fourth conductor traces extend side by side at a region underlying said third light-emitting element, and a trace width of said fourth conductor trace in a region underlying said fourth light emitting element is greater than a trace width of said fourth conductor trace in the region where said third and fourth conductor traces extend side by side.

9. The light-emitting device according to claim 1, each of said first and second conductor traces has a pad at an end of said first and second conductor traces which is opposite to an end thereof electrically connected to said first and second light-emitting elements.

10. The light-emitting device according to claim 1, wherein each of said first and second light emitting elements have a semiconductor structure layer which has a first semiconductor layer of a first conductivity type, a light-emitting layer, and a second semiconductor layer of a second conductivity type stacked in that order, said semiconductor structure layer has a through hole which penetrates from a surface of said first semiconductor layer through said first semiconductor layer and light emitting layer into said second semiconductor layer, and said through hole is formed in a manner such that a gap between said first and second conductor traces is not located below said through hole.

11. The light-emitting device according to claim 10, wherein one of said first and said second conductor traces has a projection projected to the other one of said first and said second conductor traces, and the other one of said first and said second conductor traces has a recess complementary to said projection so that said gap between said first and second conductor traces is not located below said through hole.

12. The light-emitting device according to claim 11, wherein said second conductor trace has said projection.

13. The light-emitting device according to claim 3, further comprising a phosphor layer which is continuously formed on the light-emitting elements across all of said plurality of light-emitting elements on all of said plurality of supports.

* * * * *